(12) United States Patent
Nakanishi et al.

(10) Patent No.: US 8,964,402 B2
(45) Date of Patent: Feb. 24, 2015

(54) ELECTRONIC DEVICE, INTERPOSER AND METHOD OF MANUFACTURING ELECTRONIC DEVICE

(75) Inventors: Teru Nakanishi, Kawasaki (JP);
Nobuyuki Hayashi, Kawasaki (JP);
Masaru Morita, Kawasaki (JP);
Yasuhiro Yoneda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 133 days.

(21) Appl. No.: 13/331,105

(22) Filed: Dec. 20, 2011

(65) Prior Publication Data

US 2012/0176759 A1    Jul. 12, 2012

(30) Foreign Application Priority Data

Jan. 11, 2011    (JP) .................. 2011-003207

(51) Int. Cl.
*H05K 7/00*    (2006.01)
*H05K 1/11*    (2006.01)
(Continued)

(52) U.S. Cl.
CPC ........ *H01L 23/49827* (2013.01); *H05K 3/3436* (2013.01); *H01L 2924/09701* (2013.01);
(Continued)

(58) Field of Classification Search
CPC ........... H01L 2224/16145; H01L 2224/32145; H01L 25/0657; H01L 23/49827; H05K 1/0298; H05K 2201/10674
USPC ................. 174/260, 263; 361/807, 809, 812, 361/792–796, 760, 765, 767, 770, 783, 729, 361/735
See application file for complete search history.

(56) References Cited

U.S. PATENT DOCUMENTS 5,798,567 A * 8/1998 Kelly et al. .................. 257/723
6,080,936 A    6/2000 Yamasaki
(Continued)

FOREIGN PATENT DOCUMENTS

JP    8-236898    9/1996
JP    10-12990    1/1998
(Continued)

OTHER PUBLICATIONS

Chinese Office Action dated Dec. 30, 2013, in the corresponding Chinese patent application No. 201110439744.X, with English translation.
(Continued)

*Primary Examiner* — Dion R Ferguson
(74) *Attorney, Agent, or Firm* — Kratz, Quintos & Hanson, LLP

(57) ABSTRACT

An electronic device includes a wiring board including a first electrode and a second electrode, a semiconductor device mounted on the wiring board and including a first terminal and a second terminal, an interposer provided between the wiring board and the semiconductor device, the interposer including a conductive pad and a sheet supporting the conductive pad, the conductive pad having a first surface on a side of the wiring board and a second surface on a side of the semiconductor device, a first solder connecting the first electrode positioned outside of an area in which the interposer is disposed with the first terminal positioned outside of the area, a second solder connecting the second electrode positioned inside of the area with the first surface of the conductive pad, and a third solder connecting the second terminal positioned inside of the area with the second surface of the conductive pad.

13 Claims, 14 Drawing Sheets

(51) Int. Cl.
*H01L 23/498* (2006.01)
*H05K 3/34* (2006.01)

(52) U.S. Cl.
CPC ............ *H05K2201/09136* (2013.01); *H05K 2201/10378* (2013.01); *H05K 2201/10992* (2013.01); *H01L 23/49816* (2013.01); *H01L 2924/15311* (2013.01); *H01L 2224/16* (2013.01)
USPC ........... 361/760; 174/260; 174/263; 361/767; 361/807; 361/810

(56) References Cited

U.S. PATENT DOCUMENTS

| | | | |
|---|---|---|---|
| 6,156,414 A | 12/2000 | Shimoto et al. | |
| 6,507,118 B1 | 1/2003 | Schueller | |
| 6,717,066 B2 | 4/2004 | Vandentop et al. | |
| 7,245,022 B2 * | 7/2007 | Farooq et al. | 257/778 |
| 7,462,939 B2 * | 12/2008 | Sundstrom | 257/778 |
| 2003/0103338 A1 * | 6/2003 | Vandentop et al. | 361/767 |

FOREIGN PATENT DOCUMENTS

| | | |
|---|---|---|
| JP | 11-067849 A | 3/1999 |
| JP | 11-145205 A | 5/1999 |
| JP | 2004-504725 A | 2/2004 |
| JP | 2004-342959 A1 | 12/2004 |

OTHER PUBLICATIONS

Office Action dated Nov. 25, 2014 corresponding to Japanese Patent Application No. 2011-003207 with Partial Translation.

* cited by examiner

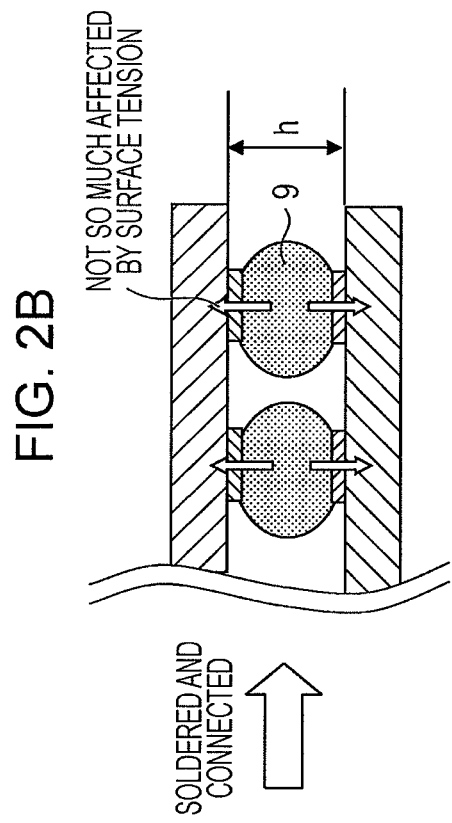
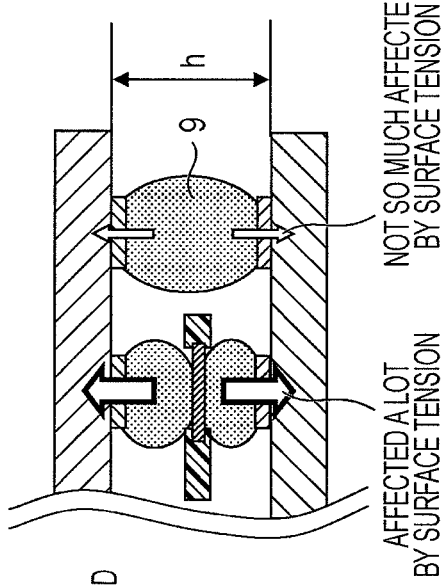
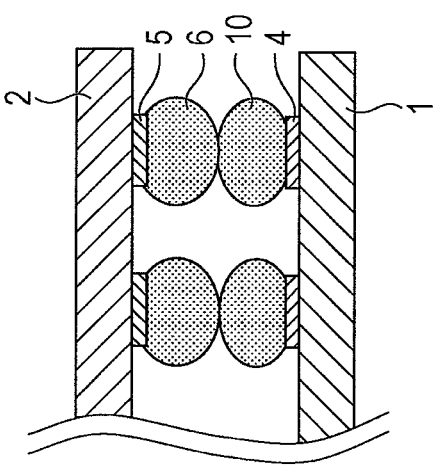
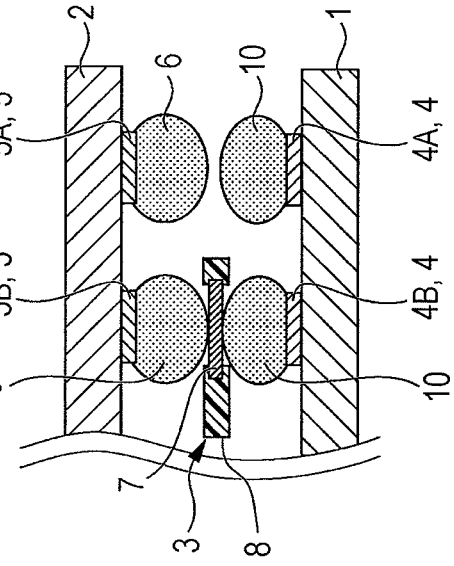

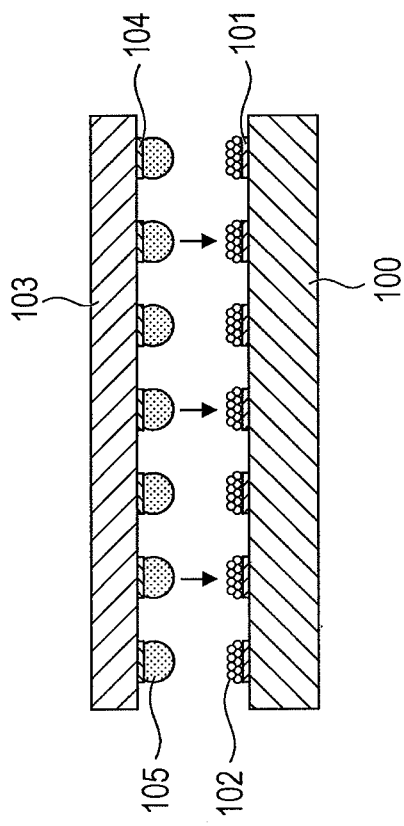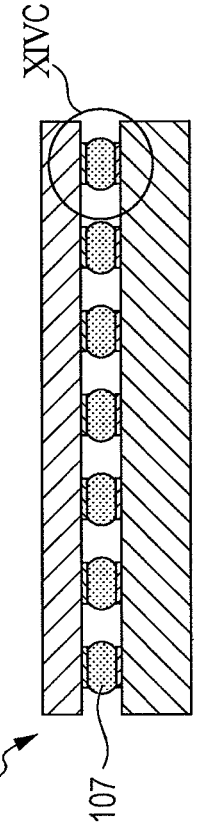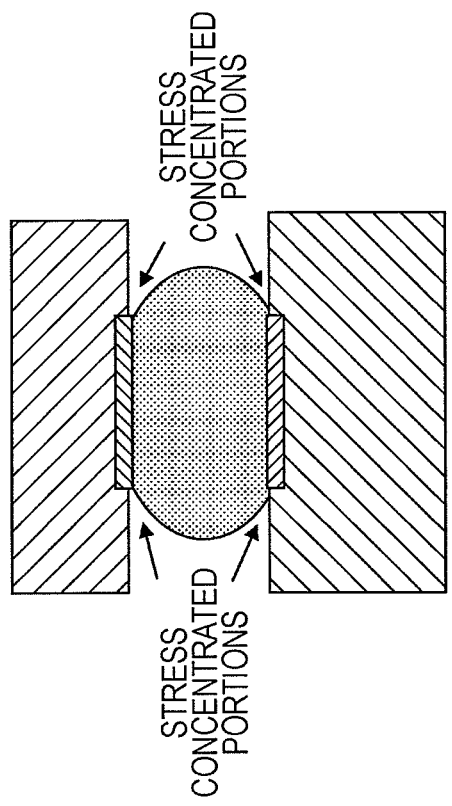

ELECTRONIC DEVICE, INTERPOSER AND METHOD OF MANUFACTURING ELECTRONIC DEVICE

CROSS-REFERENCE TO RELATED APPLICATION

This application is based upon and claims the benefit of priority of the prior Japanese Patent Application No. 2011-3207, filed on Jan. 11, 2011, the entire contents of which are incorporated herein by reference.

FIELD

The embodiment is related to an electronic device, an interposer and a method of manufacturing an electronic device.

BACKGROUND

Electronic devices such as servers and personal computers are making remarkable progress to achieve higher throughput and performances in recent years.

Further, a recent trend in semiconductor devices such as semiconductor chips and semiconductor packages which are the central heart of a computer is to enhance their performances by achieving higher circuit densities and growing in size for larger capacities.

Further, a semiconductor device can be mounted on a wiring board by the use of a method for flip chip bonding. According to this mounting method, an electrode provided on a wiring board is soldered and connected with an electrode provided on a semiconductor device.

See, e.g., Japanese Laid-open Patent Publications Nos. 2004-342959, 08-236898 and 10-12990.

Incidentally, according to the above mounting method, put an electrode provided to a semiconductor device on an electrode provided to a wiring board with solder provided between the electrodes, and then melt the solder so as to mount the semiconductor device on the wiring board by soldering and connecting the electrode of the semiconductor device with the electrode of the wiring board.

As illustrated in FIG. 14A, e.g., put a solder bump 105 provided on an electrode 104 of a semiconductor device 103 on a solder paste 102 applied to an electrode 101 of a wiring board 100. Then, melt the solder paste 102 and the solder bump 105 so as to mount the semiconductor device 103 on the wiring board 100 by soldering and connecting the electrode 104 of the semiconductor device 103 with the electrode 101 of the wiring board 100, as illustrated in FIG. 14B. In this case, a mounting structure 106 in which the semiconductor device 103 is mounted on the wiring board 100 is formed by the electrode 104 of the semiconductor device 103 connected with the electrode 101 of the wiring board 100 by a solder piece 107.

In this case, the solder solidifies while surface tension is balancing self weight of the semiconductor device 103 in time of solder melting. Thus, the solder piece 107 which connects the electrode 104 of the semiconductor device 103 with the electrode 101 of the wiring board 100 is shaped like a squashed ball or a drum, i.e., a drum expanded in the middle in a vertical direction.

If the semiconductor device 103 generates heat while working and is thermally expanded, a thermal expansion difference occurs between the semiconductor device 103 and the wiring board 100. The thermal expansion difference causes stress to be applied to the solder connection connecting the electrode 104 of the semiconductor device 103 with the electrode 101 of the wiring board 100.

The thermal expansion difference causes large stress to be applied to a solder connection placed on an outer portion, in particular.

Further, if the solder piece 107 is shaped like a drum as described above, the stress tends to be concentrated on portions where the solder piece 107 comes into contact with the electrodes 101 and 104 as illustrated in FIG. 14C. Incidentally, a portion indicated with a symbol XIVC in FIG. 14B is expanded and illustrated in FIG. 14C.

Further, if the semiconductor device 103 is turned on and off, the stress is repeatedly applied to the solder connection between the electrode 104 of the semiconductor device 103 and the electrode 101 of the wiring board 100.

Thus, it is not preferable for the solder connection on the outer portion to which large stress caused by the thermal expansion difference is applied to have a portion that the stress is concentrated on.

SUMMARY

According to an aspect of the embodiment, an electronic device includes a wiring board including a first electrode and a second electrode, a semiconductor device mounted on the wiring board and including a first terminal and a second terminal, an interposer provided between the wiring board and the semiconductor device, the interposer including a conductive pad and a sheet supporting the conductive pad, the conductive pad having a first surface on a side of the wiring board and a second surface on a side of the semiconductor device, a first solder connecting the first electrode positioned outside of an area in which the interposer is disposed with the first terminal positioned outside of the area, a second solder connecting the second electrode positioned inside of the area with the first surface of the conductive pad, and a third solder connecting the second terminal positioned inside of the area with the second surface of the conductive pad.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A-2D are schematic cross sections for explaining how an interposer that the mounting structure of the first embodiment is provided with works;

FIGS. 3A-3G are schematic cross sections for explaining a method for making the interposer that the mounting structure of the first embodiment is provided with;

FIGS. 4A-4F are schematic cross sections for explaining another method for making the interposer that the mounting structure of the first embodiment is provided with;

FIGS. 14A-14C are schematic cross sections for illustrating a problem to be solved by the present invention.

DESCRIPTION OF EMBODIMENTS

A mounting structure, an interposer, a method for making them and an electronic device will be explained below.

First Embodiment

To begin with, a mounting structure, an interposer and a method for making them of a first embodiment will be explained with reference to FIGS. 1-12.

The mounting structure of the embodiment is such that a semiconductor package to be used for an electronic device such as a server and a personal computer is mounted, e.g., on a circuit board such as a mother board. Incidentally, the electronic device is called an electronic apparatus or a data apparatus, as well. Further, the circuit board is called a wiring board or a printed board, as well.

Figure 1:
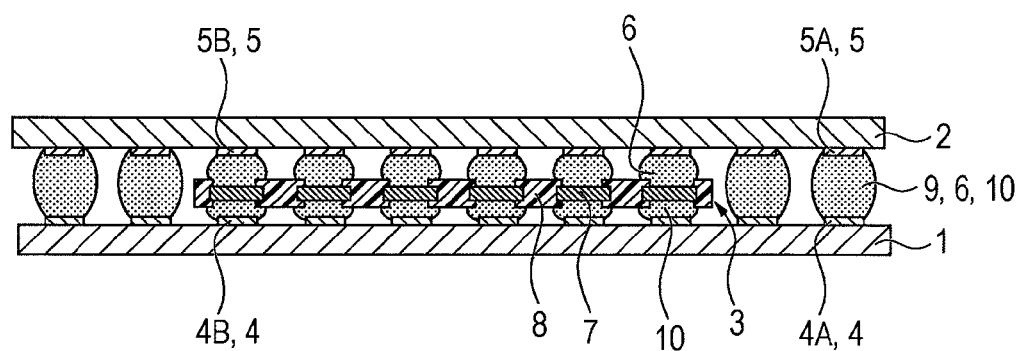
FIG. 1 is a schematic cross section which illustrates a constitution of a mounting structure of a first embodiment.

The mounting structure has a circuit board 1, a semiconductor package 2 and an interposer 3 provided between the circuit board 1 and the semiconductor package 2. Then, the semiconductor package 2 are mounted on the circuit board 1 by means of flip chip bonding having the interposer 3 put between the semiconductor package 2 and the circuit board 1 as illustrated in FIG. 1.

Figure 7:
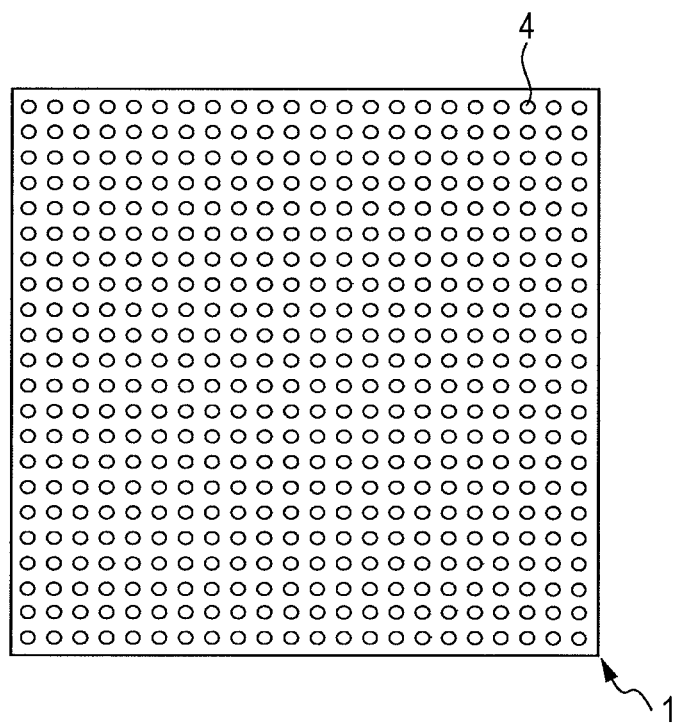
FIG. 7 schematically illustrates an arrangement of electrodes on a circuit board of a specific exemplary constitution of the mounting structure of the first embodiment.

The circuit board 1 mentioned here has a plurality of electrodes 4 arranged in a lattice on an entire area where the semiconductor package 2 can be mounted (package mounting area) (see, e.g., FIG. 7). Incidentally, the package mounting area is called a semiconductor device mounting area, as well.

The semiconductor package 2 is a BGA (Ball Grid Array) package having a package substrate, a semiconductor chip mounted on the package substrate, a plurality of electrodes 5 arranged in a lattice on the entire back of a face of the package substrate that the chip is mounted on (see, e.g., FIG. 6), and solder balls 6 provided on the respective electrodes 5. The BGA package 2 is useful for mounting, e.g., a large-sized semiconductor chip of high performance on the circuit board 1. The semiconductor chip mentioned here is a bare chip. Incidentally, the semiconductor package 2 is called a semiconductor device, as well. Further, the solder balls 6 are called solder bumps, as well.

The interposer 3 is a component including a plurality of conductive pads 7 each having front and back faces being exposed (see, e.g., FIG. 8) arranged in a lattice and a sheet 8 which supports the conductive pads 7. The sheet 8 mentioned here is a non-conductive resin sheet. That is, the sheet 8 is a non-conductive sheet and is a resin sheet, and specifically is a polyimide sheet 8 formed by a polyimide film and a polyimide cover film. Further, the conductive pad 7 is a metallic pad, and specifically is a Cu pad. Suppose, here, that the Cu pad 7 is nearly 1-20 μm in thickness. Incidentally, the pad is called an electrode or a penetrating electrode, as well. Further, the interposer is called a sheet for height control, as well.

Incidentally, although the polyimide sheet 8 is used here, the sheet 8 is not limited to that and may be any sheet as long as it can support the conductive pads 7 and fix the positions of the conductive pads 7. It is preferable to use, e.g., a sheet having poor solder affinity, i.e., a sheet that solder does not stick to, such as a resin sheet except for the polyimide sheet or a ceramic sheet. Further, it is preferable to use a non-conductive sheet. Further, a sheet having a portion formed by different materials such as a polyimide film (resin film; non-conductive resin film) and a solder resist layer (resin layer; non-conductive resin layer) can be used. Further, although the Cu pad 7 is used here, the conductive pad 7 is not limited to that and may be any material as long as it can be soldered and has a conductive characteristic. Thus, e.g., another metallic pad or a pad of a multilayered structure such as Au—Ni—Cu—Ni-An can be used.

Then, an electrode 4A provided on an outer portion of the package mounting area of the circuit board 1 is soldered and connected with an electrode 5A provided on an outer portion of the semiconductor package 2. That is, the mounting structure has a solder piece 9 which connects the electrode 4A provided on the outer portion of the package mounting area of the circuit board 1 with the electrode 5A provided on the outer portion of the semiconductor package 2. Thus, the mounting structure has a solder connection connected by the solder piece 9. The electrode 4A provided on the outer portion of the package mounting area of the circuit board 1 is thereby electrically connected with the electrode 5A provided on the outer portion of the semiconductor package 2.

Further, an electrode 4B provided on an inner portion of the package mounting area of the circuit board 1 is soldered and connected with the back face of the conductive pad 7 of the interposer 3. That is, the mounting structure has a solder piece 10 which connects the electrode 4B provided on the inner portion of the package mounting area of the circuit board 1 with the back face of the conductive pad 7 of the interposer 3. Thus, the mounting structure has a solder connection connected by the solder piece 10. The electrode 4B provided on the inner portion of the package mounting area of the circuit board 1 is thereby electrically connected with the conductive pad 7 of the interposer 3. Further, an electrode 5B provided on an inner portion of the semiconductor package 2 is soldered and connected with the front face of the conductive pad 7 of the interposer 3. That is, the mounting structure has a solder piece 6 which connects the electrode 5B provided on the inner portion of the semiconductor package 2 with the front face of the conductive pad 7 of the interposer 3. Thus, the mounting structure has a solder connection connected by the solder piece 6. The electrode 5B provided on the inner portion of the semiconductor package 2 is thereby electrically connected with the conductive pad 7 of the interposer 3. That is, the electrode 4B provided on the inner portion of the package mounting area of the circuit board 1 is electrically connected with the electrode 5B provided on the inner portion of the semiconductor package 2 via the solder piece 10, the conductive pad 7 of the interposer 3 and the solder piece 6.

The semiconductor package 2 is soldered and connected onto the circuit board 1, as described above, with the interposer 3 provided between the inner portions of the package mounting area of the circuit board 1 and the semiconductor package 2, and without the interposer 3 between their outer portions.

In particular, the mounting structure of the embodiment includes the conductive pad 7 of the interposer 3 between the solder piece 10 provided on the electrode 4B on the inner portion of the package mounting area of the circuit board 1 and the solder piece 6 provided on the electrode 5B on the inner portion of the semiconductor package 2. The mounting structure of the embodiment includes the conductive pad 7 between the upper and lower solder pieces 6 and 10 as described above, so that the upper and lower solder pieces 6 and 10 are prevented from being integrated with each other, and that the semiconductor package 2 and the circuit board 1 provided above and below each other can conduct an electric signal to and from each other.

Incidentally, suppose that the electrode 4A provided on the outer portion of the package mounting area of the circuit board 1 incorporates at least a line of electrodes put on the outermost circumference, and that so does the electrode 5A provided on the outer portion of the semiconductor package 2. In addition, suppose that the electrode 4A provided on the outer portion of the package mounting area of the circuit board 1 further incorporates a line or a plurality of lines of electrodes put on the inside of the line of the electrodes put on the outermost circumference, and that so does the electrode 5A provided on the outer portion of the semiconductor package 2, as an effect of stress caused by the thermal expansion difference is considered. Further, the inner portion implies an area except for and inside of the outer portion. Thus, the electrode 4B provided on the inner portion of the package mounting area of the circuit board 1 incorporates electrodes provided in an area on the inside of the outer portion except for the electrodes 4A provided on the outer portion, and the electrode 5B provided on the inner portion of the semiconductor package 2 incorporates electrodes provided in an area on the inside of the outer portion except for the electrodes 5A provided on the outer portion.

Why the mounting structure is constituted as described above is as follows.

That is, upon working, generating heat and being thermally expanded, a semiconductor package including a semiconductor chip causes a thermal expansion difference from a circuit board and stress applied to a solder connection which connects the semiconductor package with the circuit board.

The stress caused by the thermal expansion difference and applied to the solder connection which connects the semiconductor package with the circuit board becomes larger and smaller as the solder connection comes closer to the outer circumference and the center of the semiconductor package, respectively.

That is, the stress applied to the solder connection which connects an electrode on the outer circumference portion of the package mounting area of the circuit board with an electrode on the outer circumference portion of the semiconductor package is larger than the stress applied to the solder piece which connects an electrode on the inner portion of the package mounting area of the circuit board with an electrode on the inner portion of the semiconductor package. In case of a rectangle shaped semiconductor package, in particular, largest stress is applied to a solder connection which connects corner-arranged one of the electrodes forming the outermost line on the circumference of the package mounting area of the circuit board with corner-arranged one of the electrodes forming the outermost line on the circumference of the semiconductor package.

Speaking of this fact in the other way around, the stress applied to the solder connection which connects the electrode on the inner portion of the package mounting area of the circuit board with the electrode on the inner portion of the semiconductor package is small, and the solder connection is not so much affected by the stress caused by the thermal expansion difference.

A result of stress simulation indicates, e.g., that the stress applied to the outermost corner-arranged one of the solder connections arranged in a lattice between the circuit board and the semiconductor package is largest. Meanwhile, the stress applied to the corner-arranged one of the solder connections arranged next to and inside the outermost line of the solder connections is nearly 30-40 percent smaller than that applied to the outermost corner-arranged solder connection. It can be said in this case that the outermost arranged line of the solder connections is affected a lot by the stress caused by the thermal expansion difference, and that the solder connections arranged next to and inside the outermost line are not so much affected by the stress caused by the thermal expansion difference. Further, it can be said that a solder connection arranged on a more inner portion is further less affected by the stress caused by the thermal expansion difference.

Thus, the interposer 3 is provided between the electrodes 4B provided on the inner portion of the package mounting area of the circuit board 1 and the electrodes 5B provided on the inner portion of the semiconductor package which are not so much affected by the stress caused by the thermal expansion difference.

Incidentally, suppose that a solder piece between the semiconductor package and the circuit board is shaped like a drum. That is, as an intersection angle formed by a side of the solder piece (a face of the solder not being in contact with the electrode) with respect to a line extended from a contact face between the solder and the electrode is smaller, the stress caused by the thermal expansion difference is more likely to be concentrated on a portion where the solder is in contact with the electrode (see FIG. 14C), even if an amount of the solder does not change. That is, as the solder piece between the semiconductor package and the circuit board is lower in height, or the solder connection including the solder piece is lower in height (connection height), the stress caused by the thermal expansion difference is more likely to be concentrated on the portion where the solder is in contact with the electrode.

Meanwhile, suppose that the solder piece connecting the semiconductor package with the circuit board is cylindrically shaped. That is, as the intersection angle formed by the side of the solder piece with respect to the line extended from the contact face between the solder and the electrode is larger, the stress caused by the thermal expansion difference is more unlikely to be concentrated on the portion where the solder is in contact with the electrode so that the stress concentration is eased, even if the amount of the solder does not change. That is, as the solder piece connecting the semiconductor package with the circuit board is higher in height, or the solder connection including the solder piece is higher in height, the stress caused by the thermal expansion difference is more unlikely to be concentrated on the portion where the solder is in contact with the electrode so that the stress concentration is eased.

Further, if the solder piece 10 provided on the electrode 4 on the package mounting area of the circuit board 1 and the solder piece 6 provided on the electrode 5 of the semiconductor package 2 melt into each other and are integrated into the solder piece 9 in time of solder melting, the solder piece 9 grows in volume, as illustrated in FIGS. 2A and 2B. As an effect of surface tension is reduced with respect to the volume, then, the solder piece 9 becomes likely to be squashed. In this case, the height of the solder piece 9, or the height h of the solder connection including the solder piece 9 (connection height), becomes low.

Thus, the mounting structure of the embodiment includes the conductive pad 7 of the interposer 3 between the solder piece 10 provided on the electrode 4B on the inner portion of the package mounting area of the circuit board 1 and the solder piece 6 provided on the electrode 5B on the inner portion of the semiconductor package 2, so as to prevent the solder pieces from being integrated with each other, as illustrated in FIGS. 2C and 2D. That is, the solder piece 10 provided on the electrode 4B on the inner portion of the package mounting area of the circuit board 1 is connected with the back face (lower face) of the conductive pad 7 of the interposer 3, and the solder piece 6 provided on the electrode 5B on the inner portion of the semiconductor package 2 is connected with the front face (upper face) of the conductive pad 7 of the interposer 3. Thus, the upper and lower solder pieces 6 and 10 remain separate from each other where the interposer 3 is provided, and the semiconductor package 2 is connected with the circuit board 1 via the solder piece 10, the conductive pad 7 and the solder piece 6.

Meanwhile, the mounting structure of the embodiment does not include the conductive pad 7 of the interposer 3 between the solder piece 10 provided on the electrode 4A on the outer portion of the package mounting area of the circuit board 1 and the solder piece 6 provided on the electrode 5A on the outer portion of the semiconductor package 2, so as to integrate the solder pieces 6 and 10 with each other. That is, the solder piece 10 provided on the electrode 4A on the outer area of the package mounting area of the circuit board 1 and the solder piece 6 provided on the electrode 5A of the semiconductor package 2 melt into each other and are integrated into the solder piece 9 in time of solder melting. Thus, the semiconductor package 2 is connected with the circuit board 1 by the solder piece 9 that the upper and lower solder pieces 6 and 10 are integrated into where the interposer 3 is not provided.

In this case, the integrated solder piece 9 grows in volume and the effect of surface tension is reduced with respect to the volume, resulting in that the solder piece 9 is likely to be squashed.

The solder piece 10 provided on the electrode 4B on the inner portion of the package mounting area of the circuit board 1 and the solder piece 6 provided on the electrode 5B on the inner portion of the semiconductor package 2 do not melt into each other, though. Thus, as the solder pieces 6 and 10 are each small in volume and the effect of the surface tension is large with respect to the volume, so that the solder pieces 6 and 10 are unlikely to be squashed. As a result, the surface tension of the solder pieces 6 and 10 prevents the semiconductor package 2 from sinking much owing to its own weight.

Thus, the solder connection including the solder piece 9 that the solder piece 10 provided on the electrode 4A on the outer portion of the package mounting area of the circuit board 1 and the solder piece 6 provided on the electrode 5A on the outer portion of the semiconductor package 2 are integrated into is made higher in height, and the stress caused by the thermal expansion difference is unlikely to be concentrated and the stress concentration is eased.

That is a use of a relationship between surface tension and a radius (volume) of a solder piece heated, melted and liquidized in time of soldering connection. That is, the liquidized solder piece tries to be spherical so as to minimize its surface area by means of its own surface tension. The surface tension equals the surface area of the sphere divided by the volume of the sphere, i.e., 3/r (r is the radius). Thus, the smaller the radius is, the larger the effect of the surface tension is. That is, the solder piece tries to be spherical more effectively as the radius (volume) is smaller, and is more unlikely to be spherical as the radius (volume) is larger. In order to use such a relationship, keep each of the solder piece 10 provided on the electrode 4B on the inner portion of the package mounting area of the circuit board 1 and the solder piece 6 provided on the electrode 5B on the inner portion of the semiconductor package 2 small in volume without integrating the solder pieces 10 and 6 with each other, and integrate the solder piece 10 provided on the electrode 4A on the outer portion of the package mounting area of the circuit board 1 with the solder piece 6 provided on the electrode 5A on the outer portion of the semiconductor package 2 into a solder piece larger in volume.

According to the embodiment, as described above, provide the portion (inner portion) not so much affected by the stress caused by the thermal expansion difference (thermal stress) with the interposer 3, and control the shape of the solder piece 9 which connects the semiconductor package 2 with the circuit board 1 in the portion (outer portion) affected a lot by the thermal stress, so as to ease the stress concentration and to enhance reliability.

Then, a method for making the interposer 3 constituted as described above will be explained.

Two methods will be explained here in an exemplary case where a polyimide film that a sheet of Cu foil sticks to is used. Incidentally, a polyimide film that a sheet of Cu foil sticks to may be called a film having a conductive layer on the surface.

A first method will be explained with reference to FIGS. 3A-3G, at first.

Figure 3A:
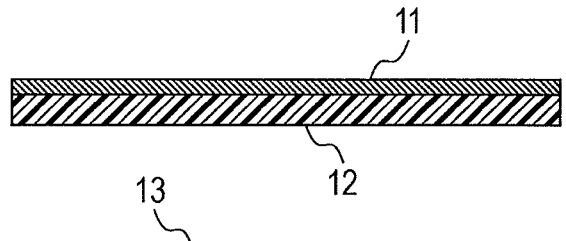
Figure 3B:

To begin with, form a resist layer 13 having a pattern which leaves a piece of Cu foil 11 of a pad forming area on a sheet of the Cu foil 11 of a polyimide film 12 that the sheet of the Cu foil 11 sticks to by using, e.g., photolithography technologies, as illustrated in FIGS. 3A and 3B.

Then, immerse what is illustrated in FIG. 3B in etching liquid which can etch a Cu material so as to remove an unnecessary portion except for the pad forming area of the Cu foil 11. After that, exfoliate the resist layer 13 so as to form a plurality of the Cu pads 7 arranged in a lattice on the polyimide film 12, as illustrated in FIG. 3C.

Figure 3C:
Figure 3D:
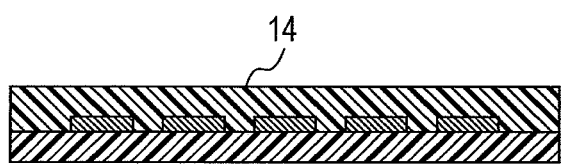

Then, stick a cover film 14 which covers the polyimide film 12 and the plural Cu pads 7 to what is illustrated in FIG. 3C by using an adhesive which is not illustrated, as illustrated in FIG. 3D. Suppose here that the cover film 14 is a polyimide film.

Figure 3E:
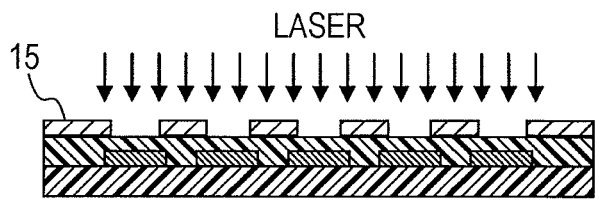
Figure 3F:
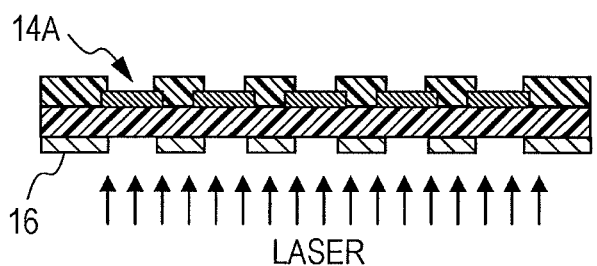

Then, put a mask 15 with apertures each having an area smaller than that of the Cu pad 7 in such a way that each of the apertures is exactly on each of the Cu pads 7. Remove unnecessary portions of the cover film 14 by, e.g., emitting laser beams for etching so as to expose a front face of each of the Cu pads 7, as illustrated in FIGS. 3E and 3F. That is, form apertures 14A each reaching the front face of each of the plural Cu pads 7 and having an area smaller than that of the Cu pad 7 in the cover film 14.

Figure 3G:
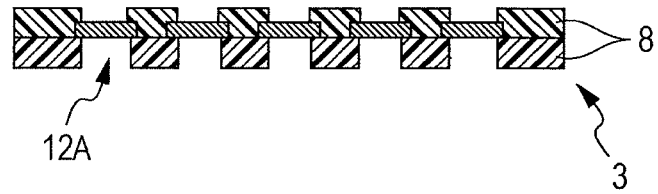

Then, put a mask 16 with apertures each having an area smaller than that of the Cu pad 7 in such a way that each of the apertures is exactly below each of the Cu pads 7. Remove unnecessary portions of the polyimide film 12 by, e.g., emitting laser beams for etching so as to expose a back face of each of the Cu pads 7, as illustrated in FIGS. 3F and 3G. That is, form apertures 12A each reaching the back face of each of the plural Cu pads 7 and having an area smaller than that of the Cu pad 7 in the polyimide film 12.

The interposer 3 having the Cu pads 7 whose front and back faces are exposed, and which are supported by the sheet 8 formed by the polyimide film 12 and the cover film 14 and arranged in a lattice, can be made in this way.

Then, a second method will be explained with reference to FIGS. 4A-4F.

Figure 4A:
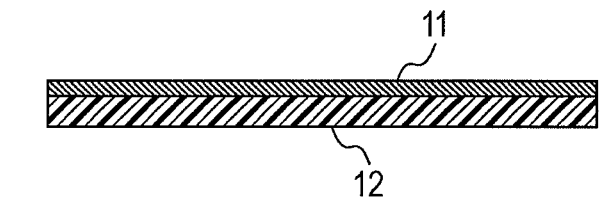
Figure 4B:

To begin with, form a plurality of Cu pads 7 arranged in a lattice on the polyimide film 12 as illustrated in FIGS. 4A and 4B through a same process as that of the first method.

Then, apply a solder resist layer 17 to the entire front face as illustrated in FIG. 4B. That is, form the solder resist layer 17 which covers the polyimide film 12 and the plural Cu pads 7.

Figure 4C:
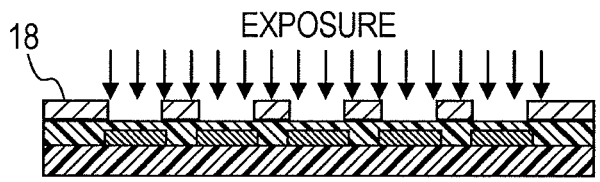
Figure 4D:
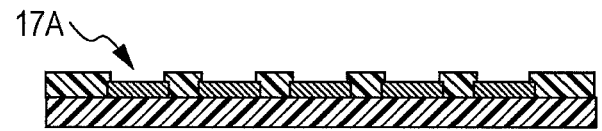

Then, put a mask 18 with apertures each having an area smaller than that of the Cu pad 7 in such a way that each of the apertures is exactly on each of the Cu pads 7. Expose and develop the solder resist layer 17 through the apertures of the mask 18 by using, e.g., ultraviolet rays so as to expose a front face of each of the Cu pads 7, as illustrated in FIGS. 4C and 4D. That is, form apertures 17A each reaching the front face of each of the plural Cu pads 7 and having an area smaller than that of the Cu pad 7 in the solder resist layer 17.

Figure 4E:
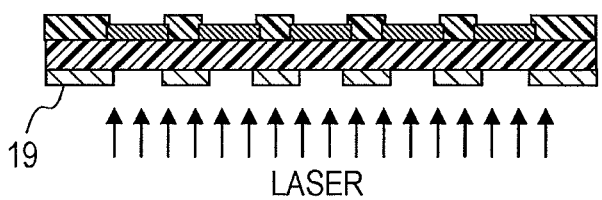
Figure 4F:
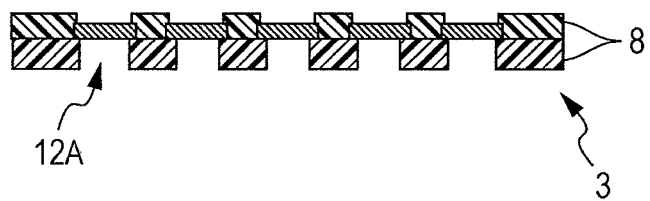

Then, put a mask 19 with apertures each having an area smaller than that of the Cu pad 7 in such a way that each of the apertures is exactly below each of the Cu pads 7. Remove unnecessary portions of the polyimide film 12 by, e.g., emitting laser beams for etching so as to expose a back face of each of the Cu pads 7, as illustrated in FIGS. 4E and 4F. That is, form apertures 12A each reaching the back face of each of the plural Cu pads 7 and having an area smaller than that of the Cu pad 7 in the polyimide film 12.

The interposer 3 having the Cu pads 7 whose front and back faces are exposed, and which are supported by the sheet 8 formed by the polyimide film 12 and the solder resist layer 17 and arranged in a lattice, can be made in this way.

Then, a method for making the mounting structure of the embodiment will be explained with reference to FIGS. 5A-5D.

Figure 5A:
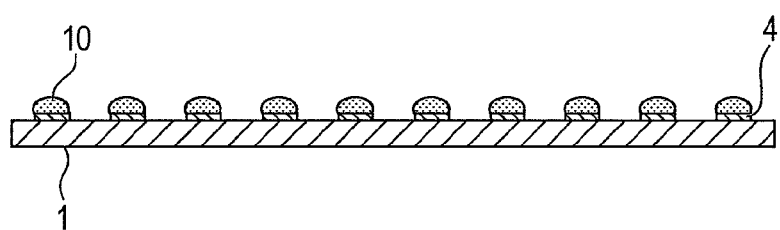
FIGS. 5A-5D are schematic cross sections for explaining a method for making the mounting structure of the first embodiment.

To begin with, supply solder pastes 10 onto a plurality of electrodes 4 provided on the circuit board 1 individually, as illustrated in FIG. 5A.

In this case, apply a solder paste 10 to each of the plural electrodes 4 provided on the circuit board 1.

Further, supply solder pieces 6 onto a plurality of electrodes 5 provided on the semiconductor package 2.

Figure 5B:
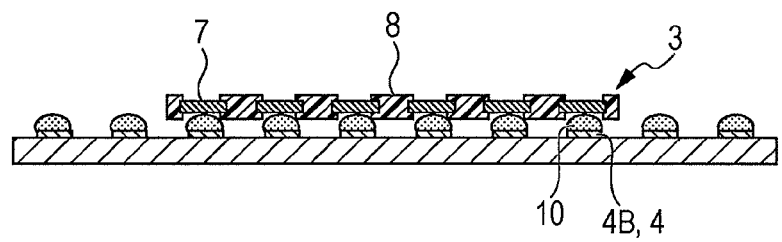
Figure 5C:
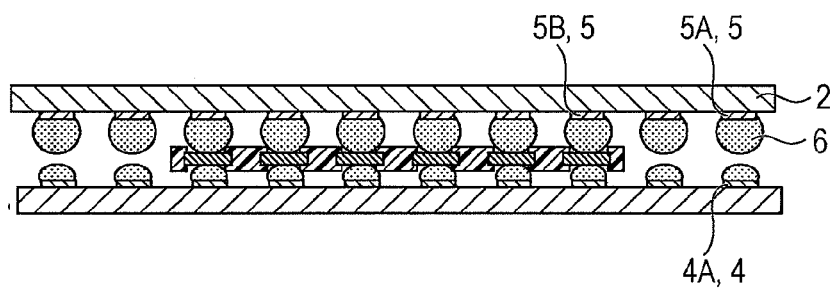

In this case, supply a solder ball 6 onto each of the plural electrodes 5 and heat the solder balls 6, so as to form solder bumps 6 (see FIG. 5C).

Then, put the interposer 3 having the conductive pads 7 whose front and back faces are exposed, and which are supported by the sheet 8, on the circuit board 1 as illustrated in FIG. 5B.

In this case, put the interposer 3 on the circuit board 1 in such a way that the back face of each of the conductive pads 7 is in contact with each of the solder pastes 10 applied onto the electrodes 4B provided on the inner portion of the package mounting area of the circuit board 1.

Then, put the semiconductor package 2 on the circuit board 1 that the interposer 3 is put on, as illustrated in FIG. 5C.

In this case, put the semiconductor package 2 on the circuit board 1 that the interposer 3 is put on, in such a way that each of the solder pastes 10 applied to the electrodes 4A provided on the outer portion of the package mounting area of the circuit board 1 and each of the solder bumps 6 formed on the electrodes 5A provided on the outer portion of the semiconductor package 2 face opposite, and that the front face of each of the conductive pads 7 of the interposer 3 is in contact with each of the solder bumps 6 formed on the electrodes 5B provided on the inner portion of the semiconductor package 2.

Figure 5D:
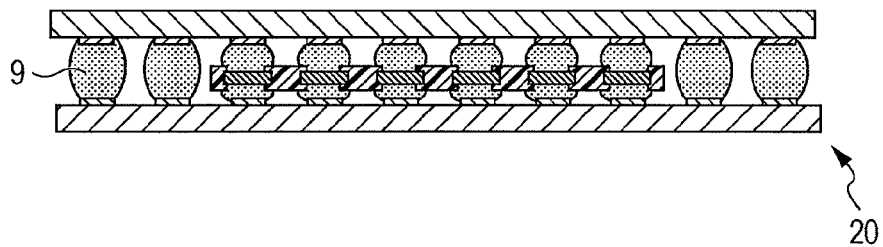

Then, heat the entire structure and melt the solder bumps/pastes 6 and 10. Solder and connect the circuit board 1 with the semiconductor package 2, the circuit board 1 with the interposer 3, and the semiconductor package 2 with the interposer 3, as illustrated in FIG. 5D.

In this case, melt the solder paste 10 applied onto the electrode 4A provided on the outer portion of the package mounting area of the circuit board 1 and the solder bump 6 formed on the electrode 5A provided on the outer portion of the semiconductor package 2 into each other, so as to solder and connect the electrode 4A of the circuit board 1 with the electrode 5A of the semiconductor package 2. That is, melt the solder paste 10 and the solder bump 6 into each other and integrate them with each other into the solder piece 9. Connect the electrode 4A provided on the outer portion of the package mounting area of the circuit board 1 with the electrode 5A provided on the outer portion of the semiconductor package 2 by means of the solder piece 9. Further, melt the solder paste 10 applied to the electrode 4B provided on the inner portion of the package mounting area of the circuit board 1, so as to solder and connect the electrode 4B of the circuit board 1 with the back face of the conductive pad 7 of the interposer 3. Further, melt the solder bump 6 formed on the electrode 5B provided on the inner portion of the semiconductor package 2, so as to solder and connect the electrode 5B of the semiconductor package 2 with the front face of the conductive pad 7 of the interposer 3.

A mounting structure 20 is thereby made such that the semiconductor package 2 is mounted on the circuit board 1 with the interposer 3 provided between them.

Incidentally, although being supposed here that the solder pastes 10 are applied onto the plural electrodes 4 provided on the circuit board 1 and the solder balls 6 are supplied onto the plural electrodes 5 provided on the semiconductor package 2, the method for supplying solder is not limited to that of the above embodiment. Other methods such as printing solder paste, solder plating, solder evaporation or solder evaporation/transfer can be used for supplying the solder.

Thus, the mounting structure, the method for making the mounting structure and the electronic device of the embodiment have an advantage in that stress concentration on a spot where a solder piece on an outer portion is in contact with an electrode and large stress caused by a thermal expansion difference is applied can be eased, and that reliability (connection reliability) can be enhanced. The reliability can be enhanced in a case where a large-sized semiconductor device 2 is mounted on the circuit board 1, in particular.

An exemplary mounting structure and an exemplary method for making the mounting structure will be specifically explained with reference to FIGS. 6-12, below.

Figure 6:
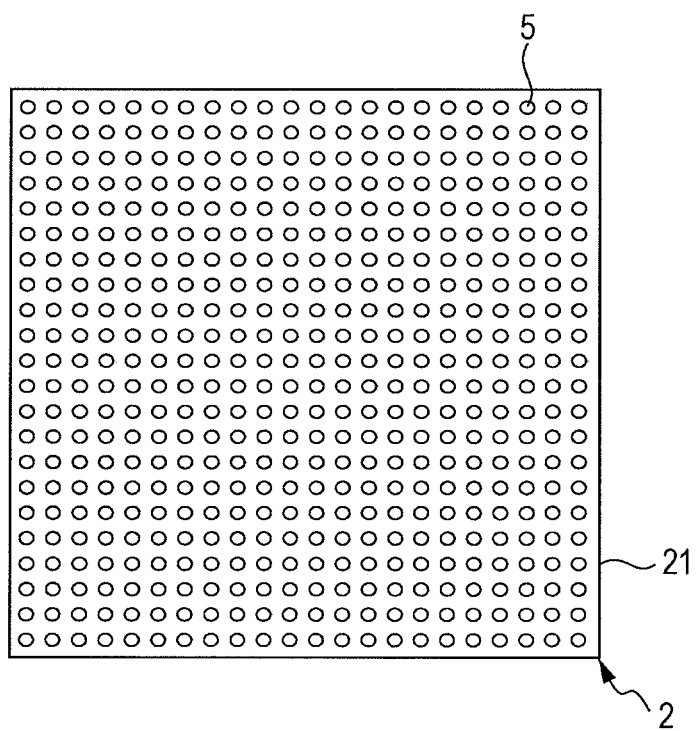
FIG. 6 schematically illustrates an arrangement of electrodes on a semiconductor package of a specific exemplary constitution of the mounting structure of the first embodiment.

The exemplary mounting structure is formed by a semiconductor package, a circuit board and an interposer which are constituted as follows. At first, the semiconductor package has vertically 22× horizontally 22 Cu electrodes 5 each being nearly 0.6 mm in diameter φ arranged in a lattice nearly every 1 mm space on a back face of a package substrate 21 made of glass ceramics of nearly 25 mm×25 mm in size, as illustrated in FIG. 6.

Then, a solder bump 6 is formed on each of the Cu electrodes 5. After applying, e.g., rosin-based flux onto each of the Cu electrodes 5, supply each of the electrodes with a solder ball 6 formed by Sn-3Ag-0.5Cu (called SAC, hereafter) of nearly 0.6 mm in diameter φ. Heat that in a heating furnace filled with nitrogenous atmosphere at, e.g., 240 degrees centigrade, so as to form a solder bump 6 on each of the Cu electrodes 5. Incidentally, the solder bump 6 is called a ball electrode, as well.

Further, the circuit board 1 is a circuit board made of glass epoxy of nearly 25 mm×25 mm in size. The circuit board 1 has vertically 22× horizontally 22 Cu electrodes 4 each being nearly 0.6 mm in diameter φ arranged in a lattice nearly every 1 mm space on the front face of the circuit board 1, as illustrated in FIG. 7.

A solder bump 10 is formed on each of the Cu electrodes 4, similarly as in the case of the semiconductor package 2 described above.

Figure 8:
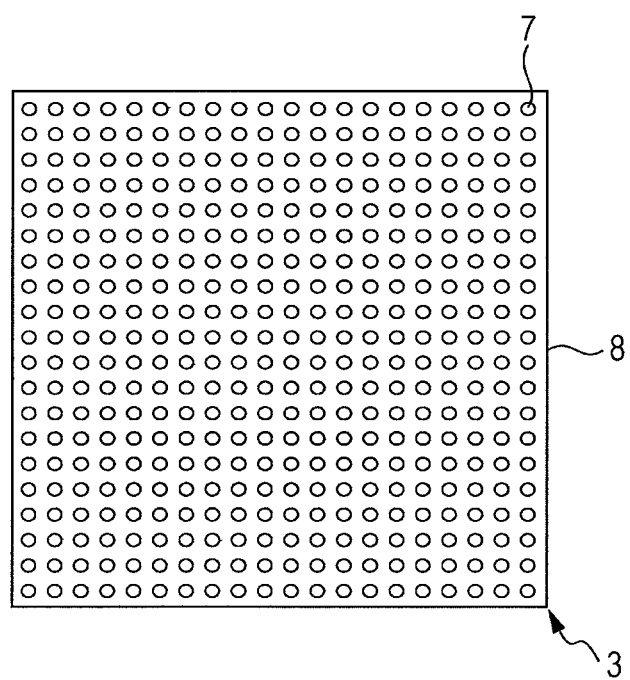
FIG. 8 schematically illustrates an arrangement of electrodes on an interposer of a specific exemplary constitution of the mounting structure of the first embodiment.

Further, the interposer 3 has Cu pads 7 each having exposed front and back faces and being nearly 0.6 mm in diameter φ arranged in a lattice nearly every 1 mm space, and a polyimide sheet 8 which supports the Cu pads 7, as illustrated in FIG. 8. The polyimide sheet 8 mentioned here is nearly 0.05 mm in thickness, and the Cu pad 7 is nearly 0.025 mm in thickness. Further, the interposer 3 in which vertically 10× horizontally 10 Cu pads 7 are arranged in a lattice (see FIG. 9B) and an interposer in which vertically 16× horizontally 16 Cu pads are arranged in a lattice (see FIG. 9A) are used here.

A mounting structure 20 is made by the use of the semiconductor package 2, the circuit board 1 and the interposer 3 described above, as follows.

Figure 9A:
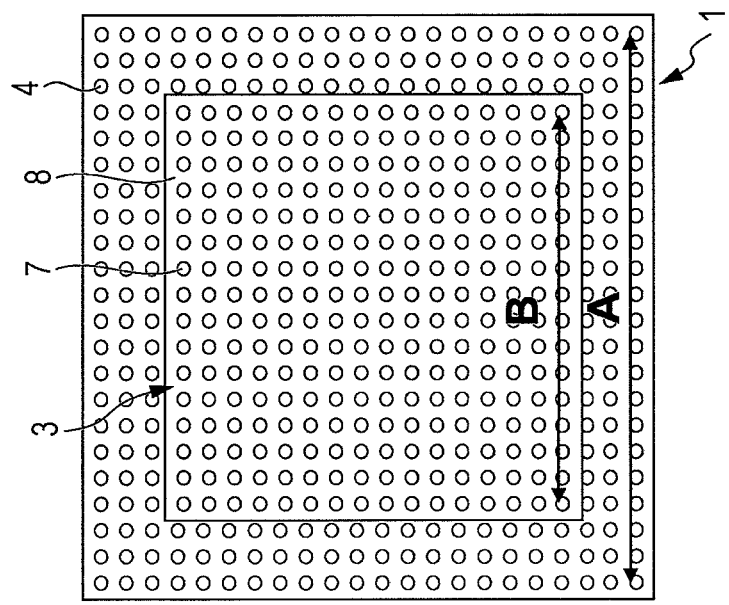
FIG. 9A schematically illustrates a state of a specific exemplary constitution of the mounting structure of the first embodiment in which an interposer that vertical 16× horizontal 16 Cu pads are arranged on is mounted on a circuit board.
Figure 9B:
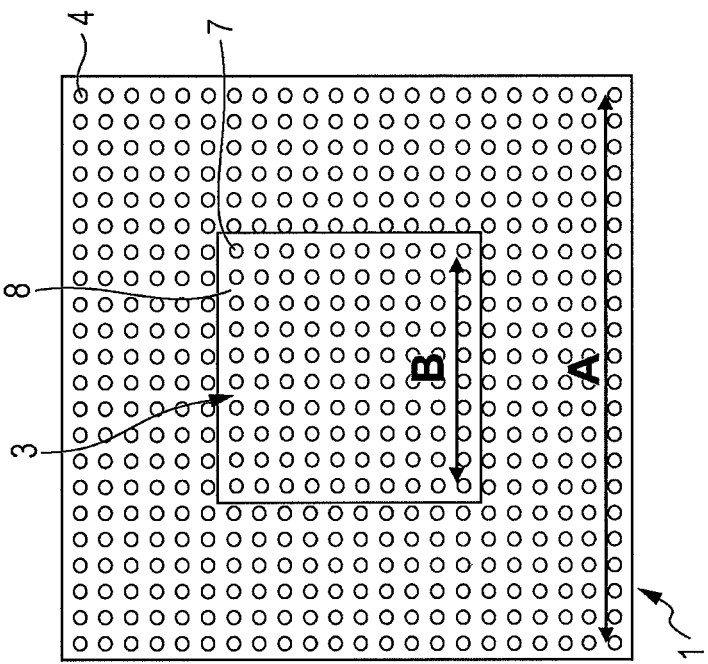
FIG. 9B schematically illustrates a state of a specific exemplary constitution of the mounting structure of the first embodiment in which an interposer that vertical 10× horizontal 10 Cu pads are arranged on is mounted on a circuit board.

To begin with, put the interposer 3 on an inner portion (including a central portion) of a package mounting area of the circuit board 1 that the solder bumps 10 are formed on as illustrated in FIGS. 9A and 9B. FIG. 9A indicates here that the interposer 3 on which vertical 10× horizontal 10 Cu pads 7 are arranged in a lattice is put. FIG. 9B indicates that the interposer 3 on which vertically 16× horizontally 16 Cu pads 7 are arranged in a lattice is put. Incidentally, FIGS. 9A and 9B indicate primarily arrangements of the circuit board 1 and the interposer 3, and omit, e.g., the solder bumps 10.

Then, put the semiconductor package 2 on which the solder bumps 6 are formed on the circuit board 1 on which the interposer 3 is put.

Heat that in a heating furnace filled with nitrogenous atmosphere in such a way that temperature of and around the solder bumps 6 and 10 is 240 degrees centigrade, so as to solder and connect the circuit board 1, the interposer 3 and the semiconductor package 2 with one another, so that the mounting structure 20 is made. Incidentally, the mounting structure 20 is called a connection.

Figure 10:
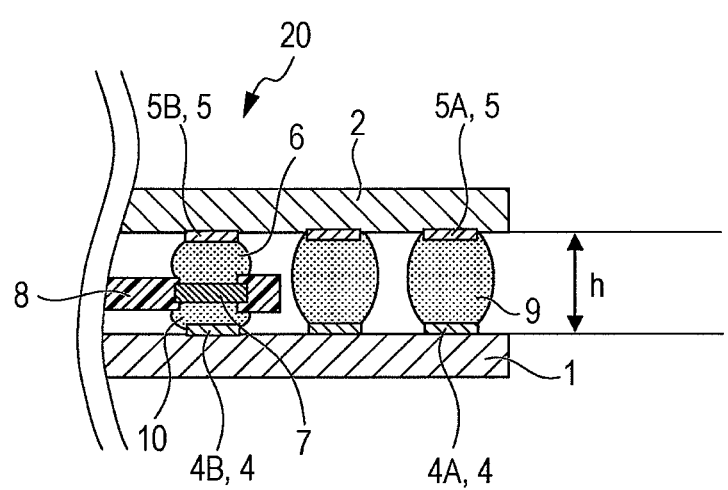
FIG. 10 schematically illustrates a solder connection in a specific exemplary constitution of the mounting structure of the first embodiment.

Then, in order to estimate a solder connection including a solder piece 9 which connects an electrode 4A provided on an outer portion of the circuit board 1 with an electrode 5A provided on an outer portion of the semiconductor package 2, the connection is grinded so that a section can be observed as illustrated in FIG. 10.

Figure 11:
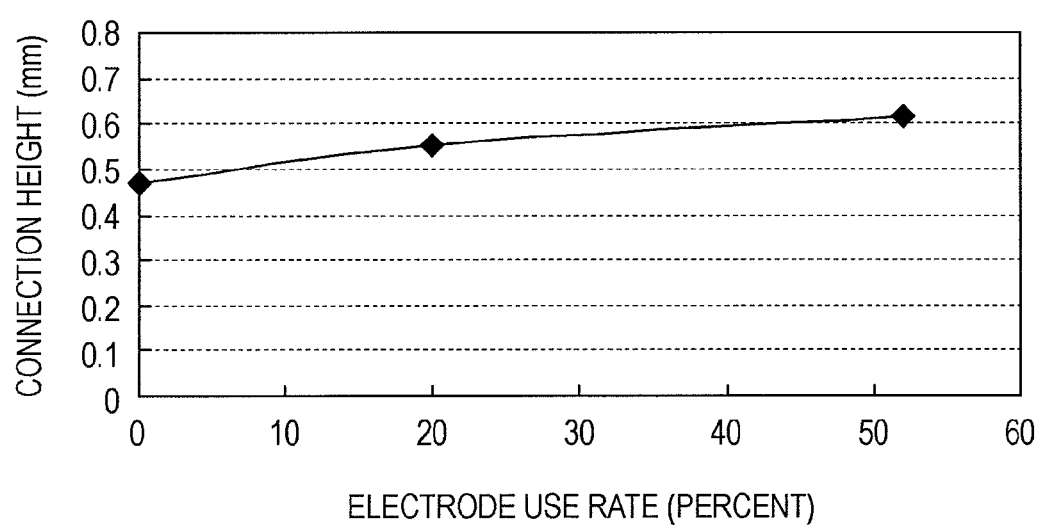
FIG. 11 schematically illustrates a relationship between a height of a solder connection and an electrode use rate in a specific exemplary constitution of the mounting structure of the first embodiment.

Then, measure a height h of the solder connection (connection height) including the solder piece 9 which connects the electrode 4A provided on the outer portion of the circuit board 1 with the electrode 5A provided on the outer portion of the semiconductor package 2, resulting in data illustrated in FIG. 11.

FIG. 11 seen here indicates a relationship between an electrode use rate and the connection height h.

Suppose here a side of the package mounting area of the circuit board 1 (or the semiconductor package 2), i.e., a side of an area on which the solder bumps 6 and 10 are formed to be A in length, and a side of the interposer 3, i.e., a side of an area on which the Cu pads 7 are provided is B in length. Then, let a ratio of an area B2 of the interposer 3 to an area A2 of the package mounting area of the circuit board 1 be the electrode use rate (in percent) (electrode use rate=B2/A2). Thus, the electrode use rate is 0 percent, nearly 20 percent and nearly 52 percent without the interposer 3 in use, with the interposer 3 on which vertically 10× horizontally 10 Cu pads 7 are arranged in a lattice in use (see FIG. 9B), and with the interposer 3 on which vertically 16× horizontally 16 Cu pads 7 are arranged in a lattice in use (see FIG. 9A), respectively.

FIG. 11 indicates that the connection height h grows as the electrode use rate becomes higher. That is, it is indicated that the connection height h grows as the area of the interposer 3 becomes larger, i.e., the number of the Cu pads 7 of the interposer 3 increases.

If, e.g., the interposer 3 on which vertically 16× horizontally 16 Cu pads 7 are arranged in a lattice is in use (see FIG. 9A), the connection height h can be made nearly 30 percent higher than that without the interposer 3 in use.

Figure 12:
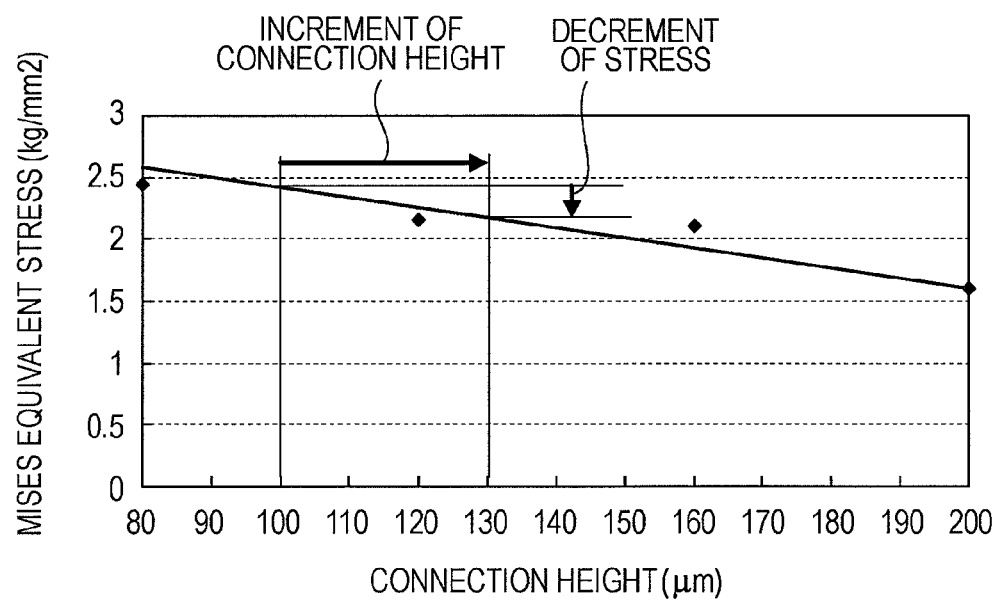
FIG. 12 schematically illustrates a relationship between a height of a solder connection and stress applied to the solder connection in a specific exemplary constitution of the mounting structure of the first embodiment.

FIG. 12 indicates here a relationship between the connection height h and tension applied to the solder connection. FIG. 12 indicates here a simulated result of Mises equivalent stress in a case where the connection height changes while the volume of the solder to be used remains constant, e.g., for flip chip bonding of a semiconductor package on which electrodes of nearly 200 μm in diameter φ are arranged.

If the connection height h grows from nearly 100 μm to nearly 130 μm by nearly 30 percent, Mises equivalent stress applied to the spot of the solder connection that the stress is concentrated on is eased by nearly ten percent, as illustrated in FIG. 12.

Thus, make the connection height h nearly 30 percent higher with the interposer 3 on which vertically 16× horizontally 16 Cu pads 7 are arranged in a lattice in use, so that Mises equivalent stress applied to the spot of the solder connection that the stress is concentrated on can be eased and made nearly ten percent lower than that without the interposer 3 in use, as described above. Then, if the stress applied to the solder connection is eased by nearly ten percent, a lifetime of the solder connection can be estimated nearly 20-40 percent longer than that before the stress is eased with reference to modified Coffin-Manson equation to be used as a fatigue lifetime predictive equation.

It is enough to provide the portion not so much affected by the stress caused by the thermal expansion difference (inner portion) with the interposer 3 without changing much of a process for mounting the semiconductor package 2 on the circuit board 1, as described above. The height of the solder connection on the portion affected a lot by the stress (outer portion) can thereby be made higher, and the solder connection can be made more reliable.

Incidentally, although being supposed to have an area larger than those of the electrode 5 of the semiconductor package 2 and the electrode 4 of the circuit board 1 according to the above embodiment, the conductive pad 7 is not limited to the above.

The conductive pad may have, e.g., a same area as those of the electrodes of the semiconductor package (semiconductor device) and of the circuit board (wiring board).

Further, the conductive pad may have, e.g., an area smaller than those of the electrodes of the semiconductor package (semiconductor device) and of the circuit board (wiring board). The height of the solder piece on the outer portion can thereby be made still higher, and so can the height of the solder connection including the solder piece.

Second Embodiment

Figure 13:
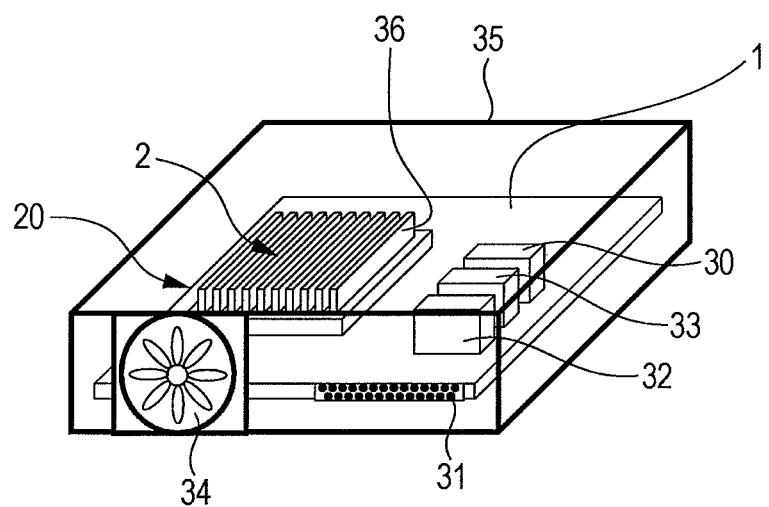
FIG. 13 is a schematic perspective which illustrates a constitution of an electronic device of a second embodiment.

Then, an electronic device of a second embodiment will be explained with reference to FIG. 13.

The electronic device of the embodiment is one having the mounting structure 20 of the first embodiment described above, i.e., the mounting structure 20 such that the semiconductor package 2 is mounted on the circuit board 1 with the interposer 3 provided between them.

The electronic device is, e.g., a server or a personal computer. The electronic device has the mounting structure 20 of the first embodiment described above. The electronic device further has other parts such as power supply parts 30, connector parts 31, controller parts 32 and memory parts 33 mounted on the circuit board 1, and is contained in a housing structure 35 provided with a cooling fan 34, as illustrated in FIG. 13. Then, the respective parts 2 and 30-33 mounted on the circuit board 1 are electrically connected to the circuit board 1. Further, the cooling fan 34 that the housing structure 35 is provided with can ventilate a cooling fin 36 that the semiconductor package 2 mounted on the circuit board 1 put in the housing structure 35 is provided with.

As having the mounting structure of the first embodiment, the electronic device of the embodiment has an advantage in achieving higher reliability (connection reliability).

Others

Incidentally, the present invention is not limited to the constitutions written as to the respective embodiments described above, and can be variously modified within the scope of the present invention.

Although, e.g., the exemplary mounting structure such that the semiconductor package 2 is mounted on the circuit board 1 with the interposer 3 provided between them is explained according to the respective embodiments described above, the mounting structure is not limited to the above. In a mounting structure such that a bare chip (semiconductor device) is mounted on a package substrate (wiring board), e.g., the interposer of the respective embodiments described above can be provided between the bare chip and the package substrate. Further, in a mounting structure such that a bare chip (semiconductor device) is mounted on a circuit board (wiring board), the interposer of the respective embodiments described above can be provided between the bare chip and the circuit board.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
   a wiring board including a first electrode and a second electrode;
   a semiconductor device including a package substrate and a semiconductor chip using semiconductor material mounted on the wiring board and including a first terminal and a second terminal;
   an interposer provided between the wiring board and the semiconductor device, the interposer including an electrically conductive pad and a sheet supporting the electrically conductive pad, the electrically conductive pad having a first surface on a side of the wiring board and a second surface on a side of the semiconductor device;
   a first solder electrically connecting the first electrode positioned outside of an area in which the interposer is disposed with the first terminal positioned outside of the area;
   a second solder electrically connecting the second electrode positioned inside of the area with the first surface of the conductive pad; and
   a third solder electrically connecting the second terminal positioned inside of the area with the second surface of the electrically conductive pad,
   wherein the first terminal and the second terminal are formed on a third surface of the semiconductor device, and a first distance between an edge of the third surface and the first terminal is shorter than a second distance between the edge of the third surface and the second terminal, and the second electrode and the second terminal are electrically connected to each other via the second solder and the electrically conductive pad and the third solder.

2. The electronic device according to claim 1, wherein the sheet is formed of an insulating material.

3. The electronic device according to claim 1, wherein the sheet is formed of one of a resin and a ceramic.

4. The electronic device according to claim 1, wherein the conductive pad is formed of a metal.

5. The electronic device according to claim 1, wherein the conductive pad has an area smaller than an area of each of the first electrode, the second electrode, the first terminal and the second terminal.

6. The electronic device according to claim 1, wherein the semiconductor device is a semiconductor package.

7. An interposer which is to be provided between a wiring board and a semiconductor device, the interposer comprising:
   a plurality of electrically conductive pads arranged in a lattice, each of the electrically conductive pads having a first surface and a second surface opposite to the first surface, both of the first surface and the second surface being exposed; and
   a sheet which supports the electrically conductive pads, wherein
   the wiring board includes a first electrode and a second electrode,
   the semiconductor device includes a third surface, and includes a first terminal and a second terminal formed on the third surface,
   the first electrode is positioned outside of an area in which the interposer is disposed, and the first electrode is electrically connected to the first terminal positioned outside of the area with a first solder;
   the second electrode is positioned inside of the area, and is electrically connected to the first surface of a first conductive pad among the plurality of conductive pads with a second solder;
   the second terminal is positioned inside of the area, and is electrically connected to the second surface of the first conductive pad with a third solder; and a first distance between an edge of the third surface and the first terminal is shorter than a second distance between the edge of the third surface and the second terminal, and the second electrode and the second terminal are electrically connected to each other via the second solder and the electrically conductive pad and the third solder.

8. The interposer according to claim 7, wherein the sheet is formed of an insulating material.

9. The interposer according to claim 7, wherein the sheet is formed of one of a resin and a ceramic.

10. The interposer according to claim 7, wherein the sheet includes:
a resin sheet; and
a solder resist layer formed on the resin sheet.

11. The interposer according to claim 7, wherein each of the conductive pads is formed of a metal.

12. The electronic device according to claim 1, wherein the electrically conductive pad has an area smaller than an area of each of the first electrode, the second electrode, the first terminal, and the second terminal.

13. The interposer according to claim 7, wherein the electrically conductive pad has an area smaller than an area of each of the first electrode, the second electrode, the first terminal, and the second terminal.

* * * * *